(12) United States Patent
Radhakrishnan et al.

(10) Patent No.: US 11,735,535 B2
(45) Date of Patent: Aug. 22, 2023

(54) COAXIAL MAGNETIC INDUCTORS WITH PRE-FABRICATED FERRITE CORES

(71) Applicant: Intel Corporation, Santa Clara, CA (US)

(72) Inventors: Kaladhar Radhakrishnan, Chandler, AZ (US); Krishna Bharath, Phoenix, AZ (US); Clive Hendricks, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 805 days.

(21) Appl. No.: 16/596,328

(22) Filed: Oct. 8, 2019

(65) Prior Publication Data
US 2021/0104475 A1  Apr. 8, 2021

(51) Int. Cl.
*H01L 23/64* (2006.01)
*H01F 17/00* (2006.01)
(Continued)

(52) U.S. Cl.
CPC ....... *H01L 23/645* (2013.01); *H01F 17/0006* (2013.01); *H01F 17/04* (2013.01); *H01F 27/32* (2013.01); *H01F 41/041* (2013.01); *H01F 41/12* (2013.01); *H01L 21/486* (2013.01); *H01L 23/49827* (2013.01); *H01L 23/49838* (2013.01); *H01L 24/16* (2013.01);
(Continued)

(58) Field of Classification Search
CPC ................. H01L 23/645; H01L 21/486; H01L 23/49827; H01L 23/49838; H01L 24/16; H01L 2224/16225; H01L 2924/19042; H01L 2924/19103; H01L 23/49816; H01L 2224/32225; H01L 2224/73204; H01L 2924/15311; H01L 23/49822; H01F 17/0006; H01F 17/04; H01F 27/32; H01F 41/041; H01F 41/12; H01F 2017/0086; H01F 41/046; H01F 2017/002; H01F 17/0013
See application file for complete search history.

(56) References Cited

U.S. PATENT DOCUMENTS

2019/0274217 A1* 9/2019 Zhang ............... H01L 23/49827
2021/0014972 A1* 1/2021 Marin .................. H05K 3/4007

* cited by examiner

*Primary Examiner* — Douglas W Owens
(74) *Attorney, Agent, or Firm* — Schwabe, Williamson & Wyatt P.C.

(57) ABSTRACT

Embodiments include an inductor, a method to form the inductor, and a semiconductor package. An inductor includes a plurality of plated-through-hole (PTH) vias in a substrate layer, and a plurality of magnetic interconnects with a plurality of openings in the substrate layer. The openings of the magnetic interconnects surround the PTH vias. The inductor also includes an insulating layer in the substrate layer, a first conductive layer over the PTH vias, magnetic interconnects, and insulating layer, and a second conductive layer below the PTH vias, magnetic interconnects, and insulating layer. The insulating layer surrounds the PTH vias and magnetic interconnects. The magnetic interconnects may have a thickness substantially equal to a thickness of the PTH vias. The magnetic interconnects may be shaped as hollow cylindrical magnetic cores with magnetic materials. The magnetic materials may include ferroelectric, conductive, or epoxy materials. The hollow cylindrical magnetic cores may be ferroelectric cores.

23 Claims, 5 Drawing Sheets

(51) Int. Cl.
*H01F 17/04* (2006.01)
*H01F 41/04* (2006.01)
*H01F 41/12* (2006.01)
*H01F 27/32* (2006.01)
*H01L 23/498* (2006.01)
*H01L 21/48* (2006.01)
*H01L 23/00* (2006.01)

(52) U.S. Cl.
CPC .............. *H01F 2017/0086* (2013.01); *H01L 2224/16225* (2013.01); *H01L 2924/19042* (2013.01); *H01L 2924/19103* (2013.01)

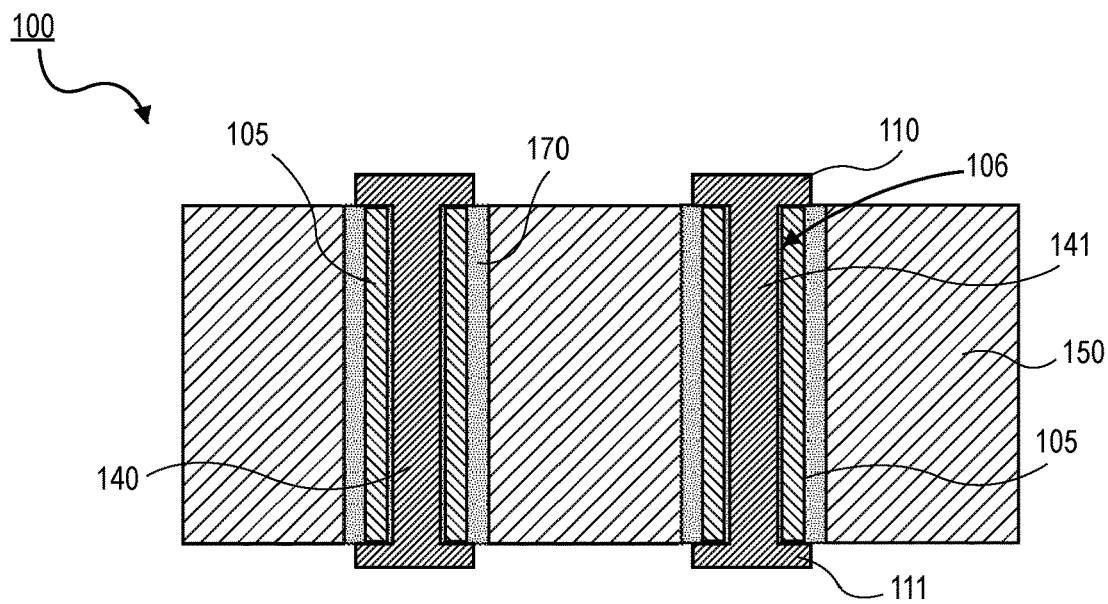
FIG. 1A
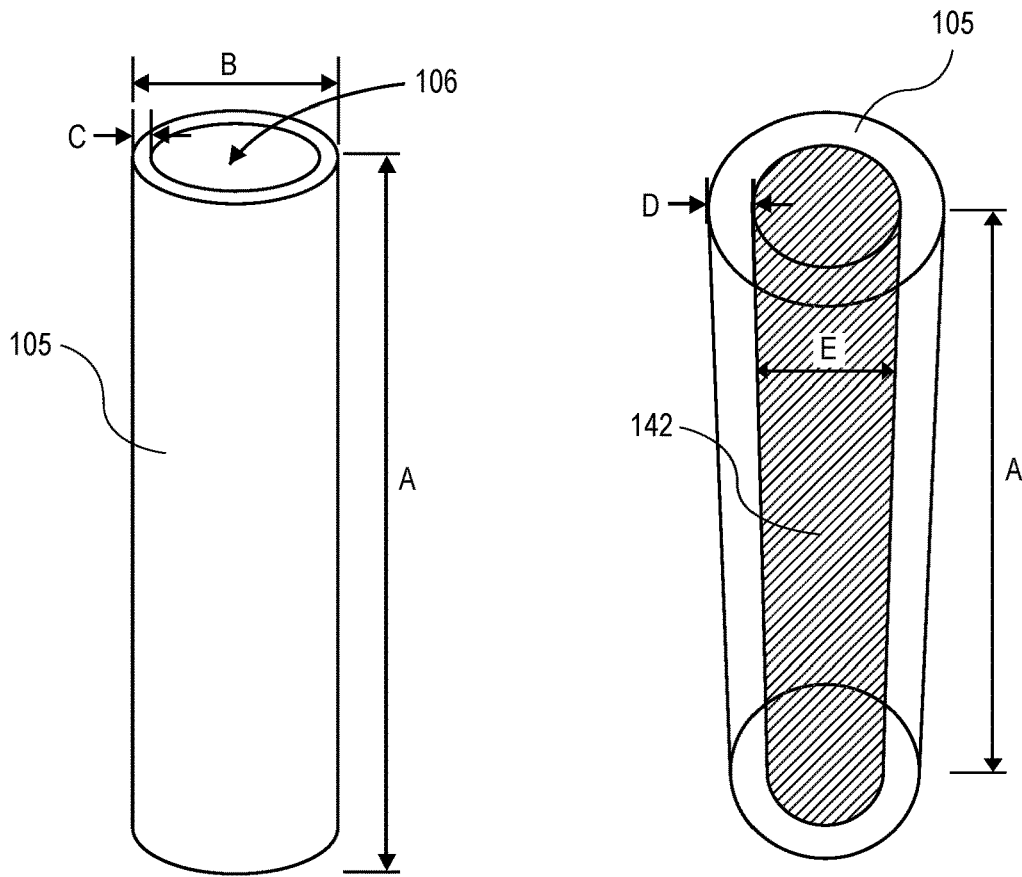
FIG. 1B      FIG. 1C

COAXIAL MAGNETIC INDUCTORS WITH PRE-FABRICATED FERRITE CORES

FIELD

Embodiments relate to packaging semiconductor devices. More particularly, the embodiments relate to semiconductor devices with embedded coaxial magnetic inductors with pre-fabricated ferrite cores.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with embedded magnetic inductors, while optimizing the performance of the semiconductor devices, however is not without issue.

Semiconductor devices typically utilize packaged magnetic inductors with voltage regulators, such as fully integrated voltage regulators (FIVRs), for voltage power regulation. FIVRs are generally implemented to operate at lower input voltages and, in most cases, also require operating at higher switching frequencies. Existing technologies, however, are pursuing on-package voltage regulators that can operate at higher input voltages (e.g., as compared to FIVRs) and lower switching frequencies.

An existing packaging solution is to use discrete inductors with the semiconductor packages. Discrete inductors are generally available with different thicknesses, but are limited when designed with low thicknesses (or z-heights). As such, these discrete inductors may be embedded within the packages, particularly for taller server parts, but embedded inductors also have limitations for design flexibility, range of achievable values, and so on.

Additionally, some existing inductors may be implemented with a coaxial magnetic inductor layer (MIL) structure in the core layer of a device's package. The coaxial MTh structure may include a copper lined plated-through hole (PTH) in the center of a larger diameter PTH that is filled with a high permeability magnetic material such as a magnetic resin. The magnetic resin may further include ferrite particle fillers used to create such magnetic inductors. However, since the magnetic resin behaves as a structure with a distributed air gap, the effective relative permeability of these existing magnetic inductors are typically limited to around 10 or so. This prevents existing packaging solutions from implementing an inductor with a high inductance (e.g., an inductance greater than 10 nH), which is typically required to target the desired lower switching frequencies or higher conversion ratios.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 1A is an illustration of a cross-sectional view of an inductor with a substrate layer, a plurality of magnetic interconnects, an insulating layer, a plurality of plated-through hole (PTH) vias, and a plurality of conductive layers, according to one embodiment.

FIG. 1B is an illustration of a perspective view of a magnetic interconnect with one or more parameters, according to one embodiment.

FIG. 1C is an illustration of a perspective view of a magnetic interconnect with one or more parameters, according to one embodiment.

DETAILED DESCRIPTION

Figure 2A:
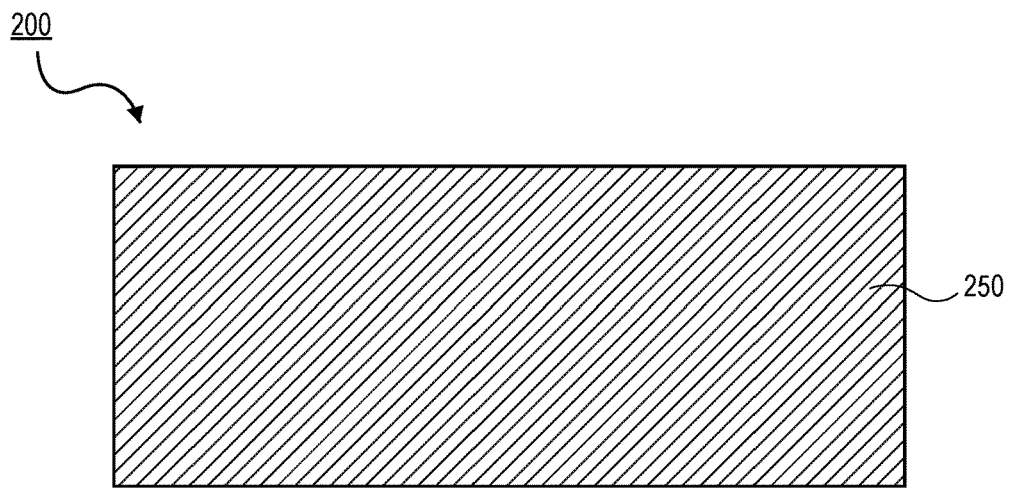
FIGS. 2A-2F are illustrations of cross-sectional views of a process flow to form an inductor with a substrate layer, a plurality of magnetic interconnects, an insulating layer, a plurality of PTH vias, and a plurality of conductive layers, according to some embodiments.

Described herein are semiconductor devices with magnetic inductors and methods of forming such magnetic inductors. The semiconductor devices with magnetic inductors described below and methods of forming such magnetic inductors may include a substrate layer, a plurality of magnetic interconnects (e.g., ferrite cores), an insulating layer, a plurality of plated-through hole (PTH) vias, and a plurality of conductive layers, according to some embodiments. In some embodiments, the magnetic inductors described herein include magnetic interconnects (or magnetic cores, ferrite cores, etc.) that may be manufactured in the shape of a hollow cylindrical shell (or the like). Accordingly, in these embodiments, the magnetic interconnects may be embedded and disposed in the substrate layer, where the magnetic interconnects may surround the PTH vias (e.g., copper-filled PTH vias) to implement the magnetic inductors.

Furthermore, the embodiments described below may include semiconductor devices with on-package voltage regulators, which may be implemented with the magnetic interconnects of the magnetic inductors. The magnetic interconnect described herein has a substantially higher permeability than a magnetic resin (e.g., as described above with the existing coaxial MIL inductors). Additionally, in some embodiments, the magnetic interconnect may be prefabricated as a ferrite core with a cylindrical shell that has an inner diameter greater than a diameter of the PTH via.

The embodiments described herein provide improvements to existing packaging solutions by enabling magnetic inductors with magnetic interconnects (or magnetic/ferrite cores) that have substantially higher permeability as compared to the lower permeability of the magnetic resin (or magnetic materials) used in the existing magnetic inductors. For example, with these magnetic interconnects/cores, the semiconductor packages (or devices) described herein may be implemented with magnetic inductors that have an inductance of approximately 20 nH or greater (e.g., as compared to existing coaxial MIL inductors that are limited to an inductance of approximately 3 nH or less). Additionally, these embodiments of the magnetic inductors therefore enable substantially higher voltage conversion ratios and higher efficiency by reducing the switching frequency of the regulators.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages/devices that have magnetic inductors with substrate layers, magnetic interconnects (e.g., ferrite cores), insulating layers, PTH vias, and conductive layers (or conductive windings).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1A is an illustration of a cross-sectional view of an inductor 100 with a substrate layer 150, a plurality of magnetic interconnects 105, an insulating layer 170, a plurality of PTH vias 140-141, and a plurality of conductive layers 110-111, according to one embodiment. Respectively, FIG. 1B is an illustration of a perspective view of the magnetic interconnect 105 with an opening 106 and one or more parameters (e.g., a thickness "A", an outer diameter "B", and a width "C"), according to one embodiment. In additional embodiments, FIG. 1C is an illustration of a perspective view of a magnetic interconnect 105 with a conductive conductor 142 and one or more parameters (e.g., a thickness "A", an outer width "D", and an inner width "E").

Referring now to FIG. 1A, a cross-sectional illustration of an inductor 100 is shown, in accordance with an embodiment. In an embodiment, the inductor 100 may include a substrate layer 150, a plurality of magnetic interconnects 105, an insulating layer 170, a plurality of PTH vias 140-141, and a plurality of conductive layers 110-111. In one embodiment, the inductor 100 may be an embedded magnetic inductor, an on-package inductor, a magnetic inductor, and/or the like.

For some embodiments, the inductor 100 may include the magnetic interconnects 105 with openings 106 that are embedded in the substrate layer 150 and the insulating layer 170. In some embodiments, the magnetic interconnects 105 may have the openings 106 to surround the respective PTH vias 140-141, where the PTH vias 140-141 and the conductive layers 110-111 may be implemented to form a plurality of conductive windings around the magnetic interconnects 105. In some embodiments, the magnetic interconnects 105 and the conductive windings of the PTH vias 140-141 and the conductive layers 110-111 may be implemented to form the magnetic inductor 100. Accordingly, in these embodiments, the magnetic interconnects 105 allow the inductor 100 to have a substantially higher L/R ratio, which therefore enables the on-package voltage regulator (or the like) to switch at a lower frequency and a higher conversion efficiency. Alternatively, the magnetic interconnect 105 provides such high inductance value(s) to the inductor 100 to enable conversion with a higher input to output voltage ratio.

In some embodiments, the inductor 100 may be implemented (or designed) with one or more shaped configurations. For example, the inductor 100 may be implemented (or shaped/designed) as a toroidal shaped inductor, a solenoid shaped inductor, a rectangular (or bar) shaped inductor, and/or the like. In an embodiment, the magnetic interconnects 105 may also be implemented with one or more shaped configurations and parameters (e.g., as shown with the magnetic interconnects 105 of FIGS. 1B-1C).

For example, as shown in FIG. 1B, the magnetic interconnect 105 may have a cylindrical (or oval) shape with the opening 106, a rectangular (or bar/strip) shape with the opening 106, and/or the like. In one embodiment, the magnetic interconnect 105 may be shaped as a hollow cylindrical magnetic shell with the opening 106, where such hollow cylindrical magnetic shell may extend vertically from the conductive layer 111 to the conductive layer 110. In some embodiments, as shown in FIG. 1B, the hollow cylindrical shell of the magnetic interconnect 105 may have one or more parameters such as a thickness "A" (or a z-height), an outer diameter "B", and a width "C". In some embodiments, as shown in FIG. 1B, the magnetic interconnect 105 may be a hollow cylindrical shell comprised of one or more magnetic materials (as described below in further detail), where the cylindrical shell has the opening 106 that exposes the inner hollow body of the magnetic interconnect 105. For example, in these embodiments, the opening 106 of the magnetic interconnect 105 may be implemented to house (or partially/fully surround) the respective PTH vias 140-141.

Furthermore, as shown in FIGS. 1A-1B, the magnetic interconnect 105 may have a thickness ("A") of approximately 100 um to 2 mm. For another embodiment, the magnetic interconnect 105 may have a thickness ("A") of approximately 100 um or less. While, in other embodiments, the magnetic interconnect 105 may have a thickness of approximately 2 mm or greater. In some embodiments, as shown in FIG. 1B, the magnetic interconnect 105 may have a diameter (or an outer diameter, an overall diameter, a total width, etc.) ("B") of approximately 55 um to 1.21 mm. For another embodiment, the magnetic interconnect 105 may have a diameter ("B") of approximately 2 mm or less. In some embodiments, as shown in FIG. 1B, the magnetic interconnect 105 may have a width (or an outer shell width) ("C") of approximately 5 um to 500 um. For another embodiment, the magnetic interconnect 105 may have a width ("C") of approximately 500 um or less. Accordingly, in these embodiments as shown in FIG. 1B, the magnetic interconnect 105 may have an inner diameter (i.e., a width of the opening 106) of approximately 50 um to 710 um. For another embodiments, the magnetic interconnect 105 may have an inner diameter of approximately 800 um or less. Note that, for illustration purposes, two magnetic interconnects 105 may be shown to surround the two respective PTH vias 140-141, however two or more magnetic interconnects 105 may be implemented to surround the two or more respective PTH vias 140-141 (e.g., the inductor 100 may have a PTH via that is not surrounded with a magnetic interconnect if desired, and/or a magnetic interconnect that does not surround a PTH via).

In other embodiments, as shown in FIG. 1C, the magnetic interconnect 105 may be a cylindrical outer shell (or a ferrite coated outer shell) with an inner conductive conductor 142 (or an inner copper conductor). In these embodiments, the cylindrical outer shell of the magnetic interconnect 105 may be comprised of one or more magnetic materials (as described below in detail), and the inner conductive conductor 142 of the magnetic interconnect 105 may be comprised of one or more conductive materials such as copper or the like. For some embodiments, as shown in FIG. 1C, the cylindrical outer shell of the magnetic interconnect 105 may surround the inner conductive conductor 142, where the cylindrical outer shell may be implemented by disposing (or coating) the one or more magnetic materials around the inner conductive conductor 142.

In some embodiments, as shown in FIG. 1C, the magnetic interconnect 105 may have one or more parameters such as the thickness "A", the outer width "D", and the inner width "E," where the thickness "A" may be defined as the thickness (or z-height), the outer width "D" may be defined as the width of the cylindrical outer shell, and the inner width "E" may be defined as the width of the inner conductive conductor. Furthermore, as shown in FIG. 1C, the magnetic interconnect 105 may have a thickness ("A") of approximately 100 um to 2 mm. For another embodiment, the magnetic interconnect 105 may have a thickness ("A") of approximately 100 um or less. While, in other embodiments, the magnetic interconnect 105 may have a thickness of approximately 2 mm or greater. In some embodiments, the cylindrical outer shell of the magnetic interconnect 105 of FIG. 1C may have a width ("D") of approximately 50 um to 500 um. While, in other embodiments, the cylindrical outer shell of the magnetic interconnect 105 of FIG. 1C may have a width ("D") of approximately 500 um or less. Additionally, in some embodiments, the inner conductive conductor 142 of the magnetic interconnect 105 of FIG. 1C may have a width (or an inner diameter) ("E") of approximately 50 um to 700 um. While, in other embodiments, the inner conductive conductor 142 of the magnetic interconnect 105 of FIG. 1C may have a width ("E") of approximately 700 um or less.

For some embodiments, the inductor 100 may embed (or dispose) the magnetic interconnect 105 into the substrate layer 150 (or one of the build-up layers), where such inductor 100 may be embedded into and/or disposed on/in a package substrate. For one embodiment, the substrate layer 150 may be a layer of the build-up layers of the package substrate. In an embodiment, the package substrate may include, but is not limited to, a package, a substrate, a printed circuit board (PCB), and a motherboard. For one embodiment, the package substrate is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more mold layers and/or one or more dielectric layers, where each dielectric layer may be a photosensitive dielectric layer. For one embodiment, the PCB may include a plurality of conductive layers (e.g., the PTH vias 140-141, the conductive layers 110-111, etc.), which may further include copper (or metallic) traces, lines, pads, vias, via pads, holes, and/or planes. For example, the package substrate may include the conductive layer 110-111, the PTH vias 140-141, the insulating layer 170 (or the insulating material), and the magnetic interconnects 105 of the inductor 100.

According to some embodiments, the substrate layer 150 may be a core substrate, a coreless substrate, an organic core/coreless substrate, and/or the like. In some embodiments, the substrate layer 150 may have a thickness of approximately 100 um to 2 mm. In other embodiments, the substrate layer 150 may have a thickness of approximately 2 mm or less. In some embodiments, the substrate layer 150 may include one or more materials such as epoxy, glass (or glass fibers), and/or the like. For example, the substrate layer 150 may be a glass fiber reinforced core substrate. In one embodiment, the substrate layer 150 may surround and partially/fully embed the magnetic interconnects 105, the PTH vias 140-141, and the insulating layer 170. Furthermore, in some embodiments, the insulating layer 170 surrounding the magnetic interconnects 150 may have a width of approximately 50 um to 200 um. In other embodiments, the insulating layer 170 may have a thickness of approximately 200 um or less For one embodiment, the magnetic interconnects 105 may be a magnetic core interconnect (or the like) such as a ferrite core interconnect. The magnetic interconnects 105 may include one or more magnetic materials. For example, the magnetic interconnects 105 may include one or more magnetic materials that exhibit the desired magnetic behavior properties needed for the implementation of higher valued inductors as described herein. That is, these magnetic materials of the magnetic interconnects 105 may be formulated for a frequency of approximately 5 MHz to 100 MHz, and/or 1 MHz or greater.

In an embodiment, the magnetic materials of the magnetic interconnects 105 may include one or more ferromagnetic (or ferrimagnetic) materials, including, but are limited to, cobalt (Co), iron (Fe), iron (III) oxide ($Fe_2O_3$) (also referred to as ferric oxide), iron (II) oxide (FeO) (also referred to as ferrous oxide) and iron (III) oxide ($FeOFe_2O_3$), nickel oxide (NiO) and iron (III) oxide ($NiOFe_2O_3$), copper (II) oxide (CuO) and iron (III) oxide ($CuOFe_2O_3$), magnesium oxide (MgO) (also referred to as cupric oxide) and iron (III) oxide ($MgOFe_2O_3$), manganese (III) bismuthide (MnBi), nickel (Ni), manganese (III) antimonide (MnSb), manganese (II) oxide (MnO) and iron (III) oxide (MnOFe$_2$O$_3$), iron yttrium oxide (Y$_3$Fe$_5$O$_{12}$), chromium (IV) oxide (CrO$_2$), manganese (III) arsenide (MnAs), or cadmium zinc telluride (CdZnTe) (also referred to as CZT), and/or any combination therein. In these embodiments, the magnetic materials of the magnetic interconnects 105 may be conductive metallic alloys (or the like) disposed (or deposited) as thin laminated layers/sheets (e.g., with a thin width of approximately 10 nm to 1 um), as high-resistivity oxides used as bulk materials, and/or as microparticles (e.g., spherical, flakes, or the like) dispersed in an epoxy resin medium (or the like).

In some embodiments, the magnetic interconnects 105 may have a thickness that is substantially equal to a thickness of the PTH vias 140-141 and/or a thickness of the substrate layer 150. In other embodiments, the magnetic interconnects 105 may have a thickness that is different than a thickness of the PTH vias 140-141 and/or a thickness of the substrate layer 150. Accordingly, as shown in FIG. 1A, the magnetic interconnects 105 may have a top surface that is substantially coplanar to a top surface of the substrate layer 150 and/or a top surface of the insulating layer 170.

In some embodiments, the insulating layer 170 may be disposed over and around the magnetic interconnects 105 and the PTH vias 140-141, where the insulating layer 170 may also be disposed in the openings 106 of the magnetic interconnects 105. The insulating layer 170 may partially/fully surround (or embed) the magnetic interconnects 105 and the PTH vias 140-141, where the insulating layer 170 may be vertically disposed adjacent to the substrate layer 150. For some embodiments, the insulating layer 170 may be disposed in between the magnetic interconnects 105 and the PTH vias 140-141, where the insulating layer 170 may separate (or isolate) the magnetic interconnects 105 from the substrate layer 150 and the respective PTH vias 140-141. For example, when the insulating layer 170 is disposed (or sandwiched) between the inner sidewall of the magnetic interconnect 105 and the outer sidewall of the PTH vias 140-141, the insulating layer 170 may have a width of approximately 10 um or less. In alternate embodiments, the insulating layer 170 may be disposed between the magnetic interconnects 105 and the substrate layer 150, while the insulating layer 170 may not be disposed in the openings 106 of the magnetic interconnects 105. That is, in these alternative embodiments, the inner sidewalls of the openings 106 of the magnetic interconnects 105 are not separated/isolated from the PTH vias 140-141 with the insulating layer 170 (i.e., the inner sidewalls of the openings 106 of the magnetic interconnects 105 may be directly coupled to the outer sidewalls of the PTH vias 140-141).

In one embodiment, the insulating layer 170 may include one or more materials (or epoxy materials), such as a dielectric layer, an encapsulation (or mold) layer, and/or the like. Additionally, the conductive layers 110-111 may include conductive pads, traces, planes, and so on. For example, as shown in FIG. 1A, the conductive layer 110 may be a top conductive layer of the inductor 100, and the conductive layer 111 may be a bottom conductive layer of the inductor 100, where the top and bottom conductive layers 110-111 may be the conductive pads of the of the inductor 100. That is, the top conductive layer 110 may be disposed on the top surfaces of the magnetic interconnects 105 and the PTH vias 140-141 (and/or the insulating layer 170), and the bottom conductive layer 111 may be disposed on the bottom surface of the magnetic interconnects 105 and the PTH vias 140-141 (and/or the insulating layer 170). In one embodiment, the top conductive pads of the conductive layer 110 may be patterned and plated (or disposed) with a width that is less than a combined width of the insulating layer 170, the magnetic interconnects 105, and the PTH vias 140-141. Likewise, in another embodiment, the bottom conductive pads of the conductive layer 111 may be patterned and plated with a width that is less than a combined width of the insulating layer 170, the magnetic interconnects 105, and the PTH vias 140-141. For example, the top/bottom conductive pads of the conductive layers 110-111 may have a width of approximately 50 um to 1 mm. While, in another embodiment, the top/bottom conductive pads of the conductive layers 110-111 may have a width of approximately 1 mm or less. In alternative embodiments, the top and bottom conductive pads of the conductive layers 110-111 may be patterned and plated with a width that is greater than a combined width of the insulating layer 170, the magnetic interconnects 105, and the PTH vias 140-141.

For one embodiment, the conductive layers 110-111 may be formed using a lithographic patterning and deposition process or the like. According to an embodiment, the deposition process may be any suitable deposition process, such as electroless plating or the like. In one embodiment, the conductive layers 110-111 may be formed using any type of conductive material including a copper layer (or a copper seed layer), and/or a combination of one or more conductive (or metallic) materials.

For one embodiment, the conductive layers 110-111 may be patterned and plated to implement the PTH vias 140-141 through the substrate layer 150. For example, a laser/drilling process (or a laser through hole (LTH) process) may be implemented through the substrate layer 150 to form via openings, and then a PTH process may be implemented in the via openings to dispose (or form) the PTH vias 140-141 that couple the conductive layers 110-111. For one embodiment, the PTH vias 140-141 may be laser-plated vias disposed (or filled) with a conductive material such as copper, and may be formed with any existing process such as an electroless copper plating process (or the like).

Additionally, as shown in FIG. 1A, the PTH vias 140-141 may have substantially vertical sidewalls. In other embodiments, the PTH vias 140-141 may have tapered sidewalls. The PTH vias 140-141 may have conductive sidewalls (e.g., copper sidewalls) that are surrounded with the respective magnetic interconnects 105 and/or the insulating layer 170, where the conductive sidewalls of the PTH vias 140-141 may vertically extend from (and/or conductively couple) the bottom conductive layer 111 to the top conductive layer 110. In some embodiments, the PTH vias 140-141 may have a width that is less than a width (or an inner diameter) of the magnetic interconnects 105. While, in some alternative embodiments, the PTH vias 140-141 may have a width that is substantially equal to a width (or an inner diameter) of the magnetic interconnects 105.

In an embodiment, the PTH vias 140-141 may have a thickness of approximately 100 um to 2 mm. In another embodiment, the PTH vias 140-141 may have a thickness of approximately 100 um or less. While, in other embodiments, the PTH vias 140-141 may have a thickness of approximately 2 mm or greater. For some embodiments, the PTH via 140 (or a first PTH via) may have a thickness that is approximately equal to a thickness of the PTH via 141 (or a second PTH via). In an embodiment, the PTH vias 140-141 may have a width of approximately 50 um to 700 um. In other embodiments, the PTH vias 140-141 may have a width of approximately 700 um or less. In some embodiments, the PTH via 140 may have a width that is approximately equal to a width of the PTH via 141. In alternate embodiments, the PTH via 140 may have a width that is different from a width of the PTH via 141. Also, in some alternate embodiments, the PTH vias 140-141 may not fully fill the opening 106 and may be implemented with an inner gap comprised of epoxy (or the like), where the PTH vias 140-141 may be thin plated shells that embed (or surround) the inner gap, and thus the thin plated shells of the PTH vias 140-141 may have a width of approximately 10 um to 50 um.

Note that the insulator 100 and the magnetic interconnects 105 of FIGS. 1A-1C may include fewer or additional packaging components based on the desired packaging design.

FIGS. 2A-2F are illustrations of cross-sectional views of a process flow to form an inductor 200 with a substrate layer 250, a plurality of magnetic interconnects 205 with openings 206, an insulating layer 270, a plurality of PTH vias 240-241, and a plurality of conductive layers 210-211, according to some embodiments. The process flow illustrated in FIGS. 2A-2F forms the inductor 200 that is substantially similar to the inductor 100 described above in FIG. 1A. Likewise, the components of the inductor 200 may be substantially similar to the components of the inductor 100 described above in FIG. 1A. For example, the substrate layer 250, the magnetic interconnects 205 with the openings 206, the insulating layer 270, the PTH vias 240-241, and the conductive layers 210-211 of the inductor 200 may be substantially similar to the substrate layer 150, the magnetic interconnects 105 with the openings 106, the insulating layer 170, the PTH vias 140-141, and the conductive layers 110-111 of the inductor 100 described above in FIG. 1A.

Figure 2B:
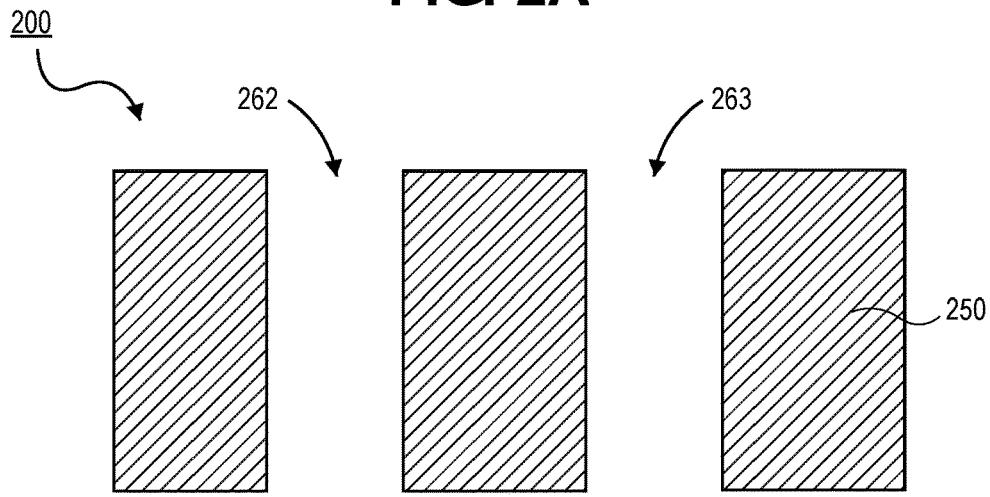
Figure 2C:
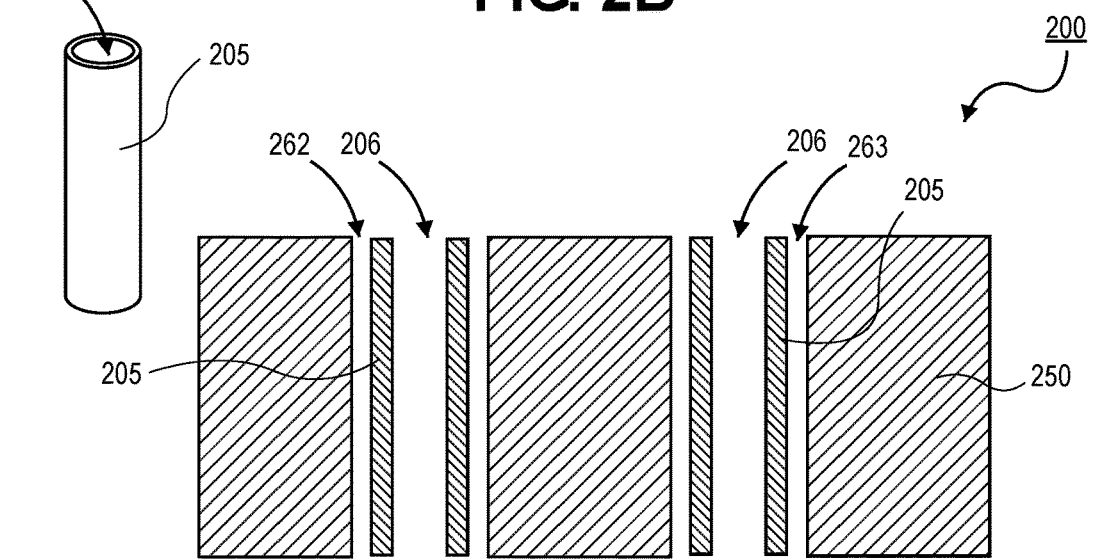
Figure 2D:
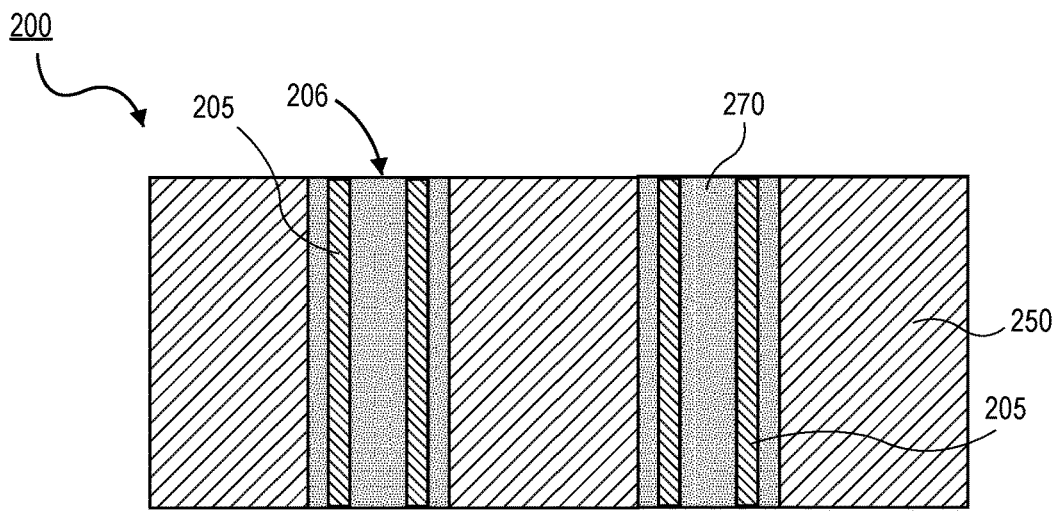
Figure 2E:
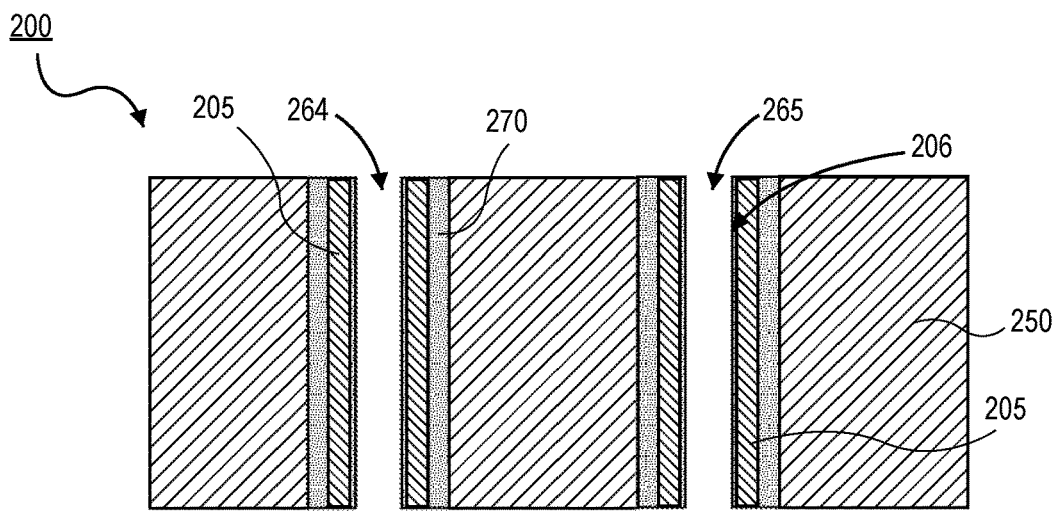
Figure 2F:
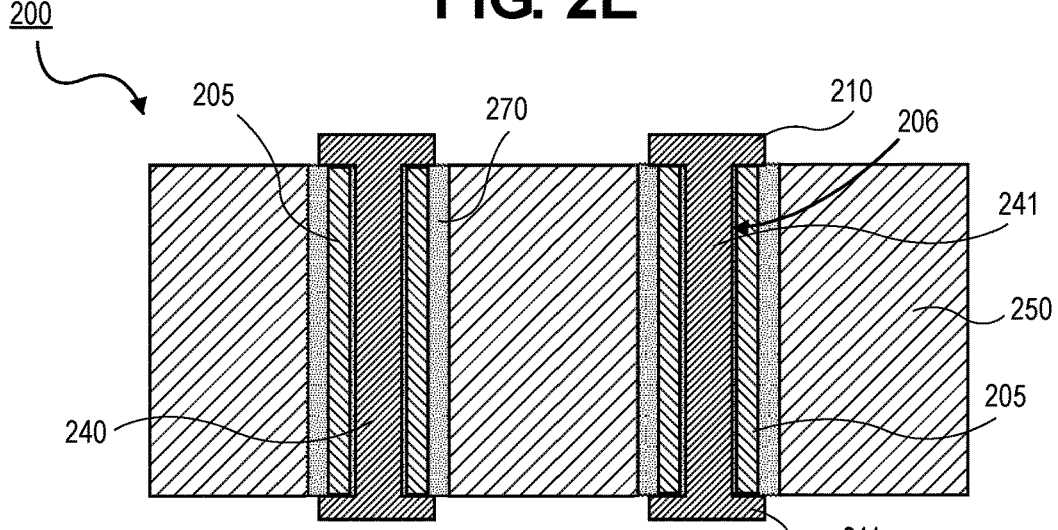

The process flow illustrated in FIGS. 2A-2F illustrates one of the approaches to embed (or dispose) the magnetic interconnects 205 with openings 206 into the substrate layer 250 and the insulating layer 270. In particular, this process flow illustrates the openings 206 of the magnetic interconnects 205 fully surrounding (or partially surrounding) the respective PTH vias 240-241, where the PTH vias 240-241 and the conductive layers 210-211 may be implemented to form a plurality of conductive windings around the magnetic interconnects 205. In some embodiments, the magnetic interconnects 205 and the conductive windings of the PTH vias 240-241 and the conductive layers 210-211 may be implemented to form the inductor 200 as shown in FIG. 2F. Additionally, as described above, the inductor 200 may be implemented with one or more shaped configurations and parameters.

Referring now to FIG. 2A, a cross-sectional illustration of an inductor 200 is shown, in accordance with an embodiment. In an embodiment, the inductor 200 may include a substrate layer 250 with a desired thickness (e.g., the desired thickness may be selected based on the desired thickness of the magnetic interconnects and/or the PTH vias). For one embodiment, the substrate layer 250 may be a package substrate (and/or the like) with a plurality of build-up layers, where the substrate layer 250 may be a layer (or a first layer) from the plurality of build-up layers of the package substrate. In an embodiment, the substrate layer 250 may be an organic core substrate and/or the like. In one embodiment, the substrate layer 250 may be disposed with a pick-and-place process (or the like) to initially form the inductor 200. The substrate layer 250 may be substantially similar to the substrate layer 150 described above in FIG. 1A.

Referring now to FIG. 2B, a cross-sectional illustration of an inductor 200 is shown, in accordance with an embodiment. In an embodiment, a plurality of openings 262-263 may be patterned (or drilled) through the substrate layer 250. In some embodiments, the openings 262-263 may be implemented (or patterned) with a laser/drilling process (or the like) to subsequently form a plurality of PTH vias as shown below in the following packaging steps.

Referring now to FIG. 2C, a cross-sectional illustration of an inductor 200 is shown, in accordance with an embodiment. In an embodiment, a plurality of magnetic interconnects 205 with the openings 206 may be disposed into the openings 262-263. In some embodiments, the openings 206 of the magnetic interconnects 205 may have an inner diameter (or a width) that may be substantially equal to or less than a width of the subsequently formed PTH vias (e.g., as shown below in FIG. 2F). For some embodiments, the magnetic interconnects 205 may be positioned to have a desired width (or spacing) between the magnetic interconnects 205 and the inner sidewalls of the openings 262-263. The magnetic interconnects 205 with the openings 206 may be substantially similar to the magnetic interconnects 105 with the openings 106 described above in FIGS. 1A-1C.

Referring now to FIG. 2D, a cross-sectional illustration of an inductor 200 is shown, in accordance with an embodiment. In an embodiment, an insulating layer 270 may be disposed over and around the magnetic interconnects 205 and the substrate layer 250, where the insulating layer 270 may thus be disposed into the openings 206 of the magnetic interconnects 205 and the respective openings of the substrate layer 250. Accordingly, as shown in FIG. 2D, the insulating layer 270 may now fully surround and embed the magnetic interconnects 205. For one embodiment, a planarization process (or the like) may be implemented on the insulating layer 270, where the insulating layer 270 may have a top surface that is substantially coplanar to the top surfaces of the magnetic interconnects 205 and the substrate layer 250. Likewise, in one embodiment, the insulating layer 270 may have a bottom surface that is substantially coplanar to the bottom surfaces of the magnetic interconnects 205 and the substrate layer 250. The insulating layer 270 may be substantially similar to the insulating layer 170 described above in FIG. 1A.

Referring now to FIG. 2E, a cross-sectional illustration of an inductor 200 is shown, in accordance with an embodiment. In an embodiment, a plurality of via openings 264-265 may be patterned (or drilled) through portions of the insulating layer 270, where such patterned/drilled portions of the insulating layer 270 may be positioned (or located) within the openings 206 of the magnetic interconnects 205. For example, in some embodiments, the via openings 264-265 may expose the inner sidewalls of the insulating layer 270 within the openings 206 of the magnetic interconnects 205. As such, in these embodiments, the via openings 264-265 may have a width that is less than a width (or an inner diameter) of the openings 206 of the magnetic interconnects 205. While, in other embodiments, the via openings 264-265 may expose the inner sidewalls of the openings 206 of the magnetic interconnects 205. As such, in these other embodiments, the via openings 264-265 may have a width that is substantially equal to a width (or an inner diameter) of the openings 206 of the magnetic interconnects 205.

As such, in these embodiments, the insulating layer 270 may have inner portions located within the openings 206 of the magnetic interconnects 205, where the inner portions of the insulating layer 270 may be directly coupled and surrounded with the inner sidewalls of the openings 206 of the magnetic interconnects 205. For some embodiments, such inner portions of the insulating layers 270 may have a slight (or minimal) width. In some embodiments, the via openings 264-265 may be implemented (or patterned) with a PTH laser/drilling process (or the like) to subsequently form the PTH vias as shown below in the following packaging steps.

Referring now to FIG. 2F, a cross-sectional illustration of an inductor 200 is shown, in accordance with an embodiment. In an embodiment, a conductive material may be disposed into the openings 206 of the magnetic interconnects 205 and the respective via openings (as described above in FIG. 2E) to form a plurality of PTH vias 240-241, where the sidewalls of the insulating layer 270 may thus surround the PTH vias 240-241. That is, the conductive material of the PTH vias 240-241 may be disposed into the respective via openings to cover the exposed sidewalls of the insulating layer 270. The PTH vias 240-241 may vertically extend approximately from the bottom surfaces of the magnetic interconnects 205 to the top surfaces of the magnetic interconnects 205. For example, an etching process, a planarization process, or the like may be used on the conductive material of the PTH vias 240-241, where the PTH vias 240-241 may have top/bottom surfaces that are substantially coplanar to the top/bottom surfaces of the insulating layer 270 and/or the magnetic interconnects 205.

Furthermore, as shown in FIG. 2F, a plurality of conductive layers 210-211 may be respectively disposed over the top and bottom surfaces of the PTH vias 240-241 and the magnetic interconnects 205. As described above, the conductive layers 210-211 and/or the PTH vias 240-241 may be initially disposed as a seed layer(s) (e.g., an electroless copper layer) that is implemented (or formed) with an electroless plating process or the like. In some embodiments, the conductive layers 210-211 may be implemented as the top and bottom conductive pads of the PTH vias 240-241. Note that, as described above, the PTH vias 240-241 and the conductive layers 210-211 may be substantially similar to the PTH vias 140-141 and the conductive layers 110-111 described above in FIG. 1A.

Note that the inductor 200 of FIGS. 2A-2F may include fewer or additional packaging components based on the desired packaging design.

Figure 3:
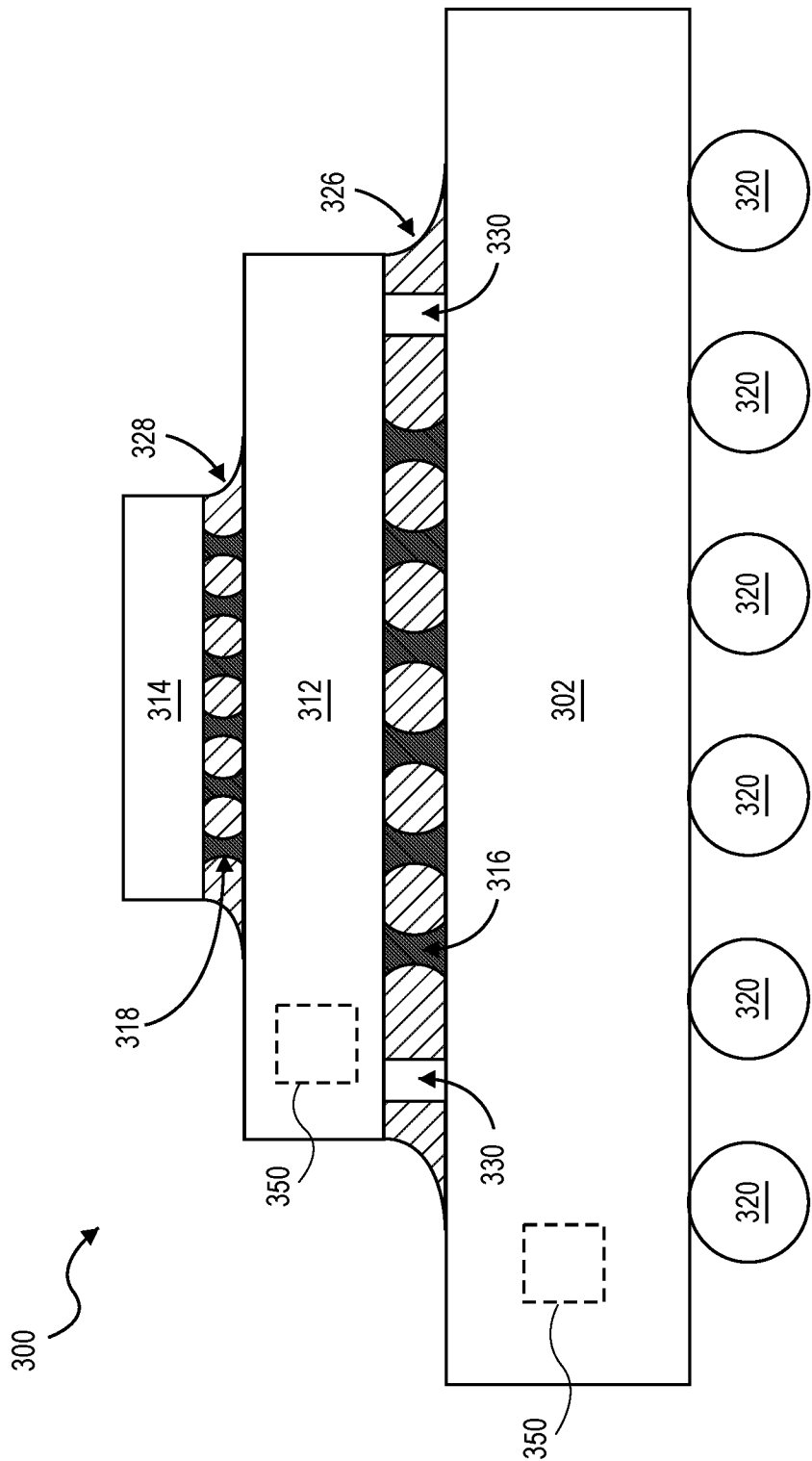
FIG. 3 is an illustration of a cross-sectional view of a semiconductor packaged system including a die, a substrate, a package substrate, and an inductor with a plurality of magnetic interconnects, according to one embodiment.

FIG. 3 is an illustration of a cross-sectional view of a semiconductor packaged system 300 including a die 314, a substrate 312, a package substrate 302, and a magnetic inductor 350, according to one embodiment. FIG. 3 illustrates a semiconductor package 300 including a die 314, a substrate 312 (or an interposer), interconnect structures (e.g., the plurality of bumps disposed below the die 314 and the substrate 312), and the package substrate 302, where the substrate 312 and/or the package substrate 302 may include one or more magnetic inductors 350, and where the magnetic inductors 350 may have substrate layers (or build-up layers), magnetic interconnects (e.g., ferrite cores), insulating layers, PTH vias, and conductive layers, according to some embodiments.

For one embodiment, the semiconductor package 300 may implement the substrate 312 and/or the package substrate 302 to include the magnetic inductors 350. For example, in one embodiment, the magnetic inductors 350 may be embedded within the package substrate 302 and/or the substrate 312. In another embodiment, the magnetic inductors 350 may also be disposed on/over the package substrate 302 and/or the substrate 312. In some embodiment, the magnetic inductors 350 of the substrate 312 and/or the package substrate 302 may be substantially similar to the inductors 100 and 200 described above in FIGS. 1A-1C and 2A-2F. Note that the semiconductor package 300 is not limited to the illustrated semiconductor packaged system, and thus may be designed/formed with fewer, alternate, or additional packaging components and/or with different interconnecting structures.

According to one embodiment, the semiconductor package 300 is merely one example of an embodiment of a semiconductor packaged system. For one embodiment, the semiconductor package 300 may include a ball grid array (BGA) package, a land grid array (LGA) package, and/or a pin grid array (PGA) package. For one embodiment, a die 314 is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, copper).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor package 300 may include fewer or additional packaging components based on the desired packaging design.

Figure 4:
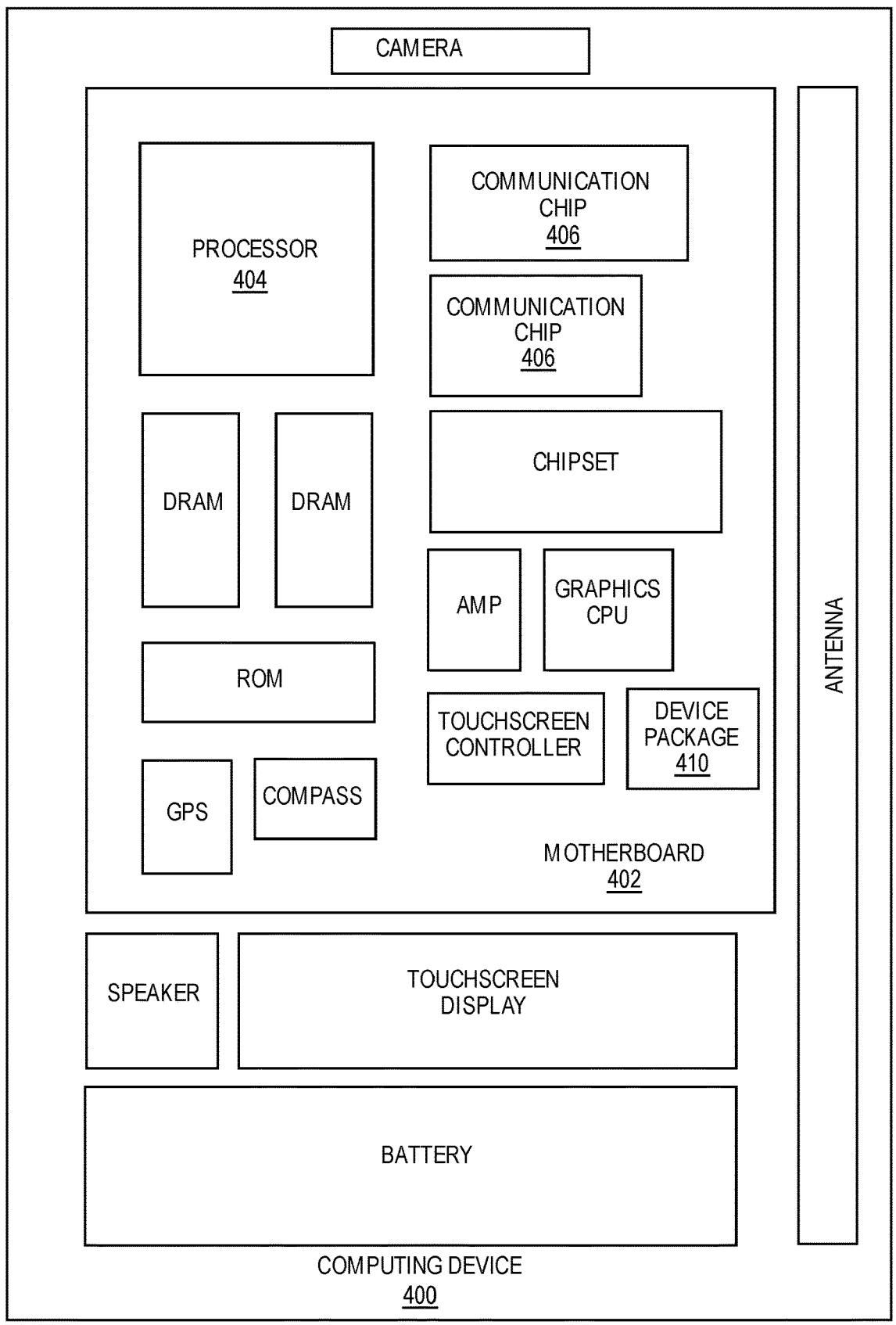
FIG. 4 is an illustration of a schematic block diagram illustrating a computer system that utilizes an inductor with a substrate layer, a plurality of magnetic interconnects, an insulating layer, a plurality of PTH vias, and a plurality of conductive layers, according to one embodiment.

FIG. 4 is an illustration of a schematic block diagram illustrating a computer system 400 that utilizes a device package 410 (or a semiconductor package) with a magnetic inductor, according to one embodiment. FIG. 4 illustrates an example of computing device 400. Computing device 400 houses a motherboard 402. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be a semiconductor package, a MCP package, or the like. Device package 410 may include, but is not limited to, a substrate, a package substrate, and/or a PCB. Device package 410 may include magnetic inductors with substrate layers (or build-up layers), magnetic interconnects (e.g., ferrite cores), insulating layers, PTH vias, and conductive layers as described herein (e.g., as illustrated and described above with the inductors 100 and 200 of FIGS. 1A-1C and 2A-2F)—or any other components from the figures described herein.

Note that device package 410 may be a single component/device, a subset of components, and/or an entire system, as the materials, features, and components may be limited to device package 410 and/or any other component of the computing device 400 that may need the magnetic inductors with magnetic interconnects (or ferrite cores) as described herein (e.g., the motherboard 402, the processor 404, and/or any other component of the computing device 400 that may need the embodiments of the magnetic inductors as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip 406 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is an inductor, comprising: a plurality of PTH vias in a substrate layer; a plurality of magnetic interconnects with a plurality of openings in the substrate layer, wherein the plurality of openings of the plurality of magnetic interconnects surround the plurality of PTH vias; an insulating layer in the substrate layer, wherein the insulating layer surrounds the plurality of PTH vias and the plurality of magnetic interconnects; a first conductive layer over the plurality of PTH vias, the plurality of magnetic interconnects, and the insulating layer; and a second conductive layer below the plurality of PTH vias, the plurality of magnetic interconnects, and the insulating layer.

In example 2, the subject matter of example 1 can optionally include that the plurality of magnetic interconnects have a thickness that is substantially equal to a thickness of the plurality of PTH vias, wherein the plurality of magnetic interconnects are shaped as a plurality of hollow cylindrical magnetic cores, wherein the plurality of hollow cylindrical magnetic cores include one or more magnetic materials, wherein the one or more magnetic materials include ferroelectric materials, conductive materials, or epoxy materials, and wherein the plurality of hollow cylindrical magnetic cores are a plurality of ferroelectric cores.

In example 3, the subject matter of examples 1-2 can optionally include that the substrate layer has a thickness that is substantially equal to the thickness of the plurality of PTH vias, and wherein the plurality of openings of the plurality of magnetic interconnects vertically extend from the second conductive layer to the first conductive layer.

In example 4, the subject matter of examples 1-3 can optionally include that the plurality of PTH vias vertically extend from the second conductive layer to the first conductive layer, and wherein the plurality of PTH vias conductively couple the second conductive layer to the first conductive layer.

In example 5, the subject matter of examples 1-4 can optionally include that the plurality of openings expose a plurality of inner sidewalls of the magnetic interconnects.

In example 6, the subject matter of examples 1-5 can optionally include that the plurality of inner sidewalls of the magnetic interconnects fully surround a plurality of outer sidewalls of the plurality of PTH vias, wherein the plurality of PTH vias have a width, and wherein the plurality of openings of the plurality of magnetic interconnects have a first width or a second width.

In example 7, the subject matter of examples 1-6 can optionally include that the plurality of openings of the plurality of magnetic interconnects have the first width that is greater than the width of the plurality of PTH vias, or wherein the plurality of openings of the plurality of magnetic interconnects have the second width that is substantially equal to the width of the plurality of PTH vias.

In example 8, the subject matter of examples 1-7 can optionally that, when the plurality of openings of the plurality of magnetic interconnects have the first width, the insulating layer is in the plurality of openings of the plurality of magnetic interconnects, and wherein, when the plurality of openings of the plurality of magnetic interconnects have the first width, the insulating layer is directly between the plurality of inner sidewalls of the magnetic interconnects and the plurality of outer sidewalls of the plurality of PTH vias.

In example 9, the subject matter of examples 1-8 can optionally include that, when the plurality of openings of the plurality of magnetic interconnects have the second width, the insulating layer is in the plurality of openings of the plurality of magnetic interconnects, the plurality of inner sidewalls of the magnetic interconnects are directly adjacent and conductively coupled to the plurality of outer sidewalls of the plurality of PTH vias, and wherein, when the plurality of openings of the plurality of magnetic interconnects have the second width, the insulating layer is only in between the plurality of magnetic interconnects and the substrate layer.

Example 10 is a method to form an inductor, comprising: patterning a plurality of first openings through a substrate layer; disposing a plurality of magnetic interconnects with a plurality of openings into the plurality of first openings of the substrate layer; disposing an insulating layer into the plurality of openings of the plurality of magnetic interconnects and the plurality of first openings of the substrate layer, wherein the insulating layer fully surrounds the plurality of magnetic interconnects; patterning a plurality of via openings through the insulating layer positioned within the plurality of openings of the plurality of magnetic interconnects; disposing a conductive material into the plurality of via openings to form a plurality of PTH vias, wherein the plurality of openings of the plurality of magnetic interconnects surround the plurality of PTH vias, and wherein the insulating layer surrounds the plurality of PTH vias and the plurality of magnetic interconnects; disposing a first conductive layer over the plurality of PTH vias, the plurality of magnetic interconnects, and the insulating layer; and disposing a second conductive layer below the plurality of PTH vias, the plurality of magnetic interconnects, and the insulating layer.

In example 11, the subject matter of example 10 can optionally include that the plurality of magnetic interconnects have a thickness that is substantially equal to a thickness of the plurality of PTH vias, wherein the plurality of magnetic interconnects are shaped as a plurality of hollow cylindrical magnetic cores, wherein the plurality of hollow cylindrical magnetic cores include one or more magnetic materials, wherein the one or more magnetic materials include ferroelectric materials, conductive materials, or epoxy materials, and wherein the plurality of hollow cylindrical magnetic cores are a plurality of ferroelectric cores.

In example 12, the subject matter of examples 10-11 can optionally include that the substrate layer has a thickness that is substantially equal to the thickness of the plurality of PTH vias, and wherein the plurality of openings of the plurality of magnetic interconnects vertically extend from the second conductive layer to the first conductive layer.

In example 13, the subject matter of examples 10-12 can optionally include that the plurality of PTH vias vertically extend from the second conductive layer to the first conductive layer, and wherein the plurality of PTH vias conductively couple the second conductive layer to the first conductive layer.

In example 14, the subject matter of examples 10-13 can optionally include that the plurality of openings expose a plurality of inner sidewalls of the magnetic interconnects.

In example 15, the subject matter of examples 10-14 can optionally include that the plurality of inner sidewalls of the magnetic interconnects fully surround a plurality of outer sidewalls of the plurality of PTH vias, wherein the plurality of PTH vias have a width, and wherein the plurality of openings of the plurality of magnetic interconnects have a first width or a second width.

In example 16, the subject matter of examples 10-15 can optionally include that the plurality of openings of the plurality of magnetic interconnects have the first width that is greater than the width of the plurality of PTH vias, or wherein the plurality of openings of the plurality of magnetic interconnects have the second width that is substantially equal the width of the plurality of PTH vias.

In example 17, the subject matter of examples 10-16 can optionally include that, when the plurality of openings of the plurality of magnetic interconnects have the first width, the insulating layer is in the plurality of openings of the plurality of magnetic interconnects, and wherein, when the plurality of openings of the plurality of magnetic interconnects have the first width, the insulating layer is directly between the plurality of inner sidewalls of the magnetic interconnects and the plurality of outer sidewalls of the plurality of PTH vias.

In example 18, the subject matter of examples 10-17 can optionally include that, when the plurality of openings of the plurality of magnetic interconnects have the second width, the insulating layer is in the plurality of openings of the plurality of magnetic interconnects, the plurality of inner sidewalls of the magnetic interconnects are directly adjacent and conductively coupled to the plurality of outer sidewalls of the plurality of PTH vias, and wherein, when the plurality of openings of the plurality of magnetic interconnects have the second width, the insulating layer is only in between the plurality of magnetic interconnects and the substrate layer.

Example 19 is a semiconductor package, comprising: a substrate on a package substrate; an inductor in or on the substrate or the package substrate; and a die on the substrate, wherein the inductor includes a plurality of PTH vias in a substrate layer, wherein the substrate layer is in the substrate or the package substrate; a plurality of magnetic interconnects with a plurality of openings in the substrate layer, wherein the plurality of openings of the plurality of magnetic interconnects surround the plurality of PTH vias; an insulating layer in the substrate layer, wherein the insulating layer surrounds the plurality of PTH vias and the plurality of magnetic interconnects; a first conductive layer over the plurality of PTH vias, the plurality of magnetic interconnects, and the insulating layer; and a second conductive layer below the plurality of PTH vias, the plurality of magnetic interconnects, and the insulating layer.

In example 20, the subject matter of example 19 can optionally include that the plurality of magnetic interconnects have a thickness that is substantially equal to a thickness of the plurality of PTH vias, wherein the plurality of magnetic interconnects are shaped as a plurality of hollow cylindrical magnetic cores, wherein the plurality of hollow cylindrical magnetic cores include one or more magnetic materials, wherein the one or more magnetic materials include ferroelectric materials, conductive materials, or epoxy materials, wherein the plurality of hollow cylindrical magnetic cores are a plurality of ferroelectric cores, wherein the plurality of PTH vias vertically extend from the second conductive layer to the first conductive layer, and wherein the plurality of PTH vias conductively couple the second conductive layer to the first conductive layer, and wherein the plurality of openings expose a plurality of inner sidewalls of the magnetic interconnects.

In example 21, the subject matter of examples 19-20 can optionally include that the substrate layer has a thickness that is substantially equal to the thickness of the plurality of PTH vias, and wherein the plurality of openings of the plurality of magnetic interconnects vertically extend from the second conductive layer to the first conductive layer.

In example 22, the subject matter of examples 19-21 can optionally include that the plurality of inner sidewalls of the magnetic interconnects fully surround a plurality of outer sidewalls of the plurality of PTH vias, wherein the plurality of PTH vias have a width, and wherein the plurality of openings of the plurality of magnetic interconnects have a first width or a second width.

In example 23, the subject matter of examples 19-22 can optionally include that the plurality of openings of the plurality of magnetic interconnects have the first width that is greater than the width of the plurality of PTH vias, or wherein the plurality of openings of the plurality of magnetic interconnects have the second width that is substantially equal the width of the plurality of PTH vias.

In example 24, the subject matter of examples 19-23 can optionally include that, when the plurality of openings of the plurality of magnetic interconnects have the first width, the insulating layer is in the plurality of openings of the plurality of magnetic interconnects, and wherein, when the plurality of openings of the plurality of magnetic interconnects have the first width, the insulating layer is directly between the plurality of inner sidewalls of the magnetic interconnects and the plurality of outer sidewalls of the plurality of PTH vias.

In example 25, the subject matter of examples 19-24 can optionally include that, when the plurality of openings of the plurality of magnetic interconnects have the second width, the insulating layer is in the plurality of openings of the plurality of magnetic interconnects, the plurality of inner sidewalls of the magnetic interconnects are directly adjacent and conductively coupled to the plurality of outer sidewalls of the plurality of PTH vias, and wherein, when the plurality of openings of the plurality of magnetic interconnects have the second width, the insulating layer is only in between the plurality of magnetic interconnects and the substrate layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. An inductor, comprising:
   a plurality of plated-through-hole (PTH) vias in a substrate layer;
   a plurality of magnetic interconnects with a plurality of openings in the substrate layer, wherein the plurality of openings of the plurality of magnetic interconnects surround the plurality of PTH vias;
   an insulating layer in the substrate layer, wherein the insulating layer laterally surrounds and is in contact with an outermost surface of the plurality of magnetic interconnects;
   a first conductive layer over the plurality of PTH vias, the plurality of magnetic interconnects, and the insulating layer; and
   a second conductive layer below the plurality of PTH vias, the plurality of magnetic interconnects, and the insulating layer.

2. The inductor of claim 1, wherein the plurality of magnetic interconnects have a thickness that is substantially equal to a thickness of the plurality of PTH vias, wherein the plurality of magnetic interconnects are shaped as a plurality of hollow cylindrical magnetic cores, wherein the plurality of hollow cylindrical magnetic cores include one or more magnetic materials, wherein the plurality of hollow cylindrical magnetic cores are a plurality of ferroelectric cores, wherein the one or more magnetic materials include one or more ferromagnetic materials, and wherein the one or more ferromagnetic materials include cobalt (Co), iron (Fe), iron (III) oxide ($Fe_2O_3$), iron (II) oxide (FeO) and iron (III) oxide ($FeOFe_2O_3$), nickel oxide (NiO) and iron (III) oxide ($NiOFe_2O_3$), copper (II) oxide (CuO) and iron (III) oxide ($CuOFe_2O_3$), magnesium oxide (MgO) and iron (III) oxide ($MgOFe_2O_3$), manganese (III) bismuthide (MnBi), nickel (Ni), manganese (III) antimonide (MnSb), manganese (II) oxide (MnO) and iron (III) oxide ($MnOFe_2O_3$), iron yttrium oxide ($Y_3Fe_5O_{12}$), chromium (IV) oxide ($CrO_2$), manganese (III) arsenide (MnAs), or cadmium zinc telluride (CdZnTe).

3. The inductor of claim 2, wherein the substrate layer has a thickness that is substantially equal to the thickness of the plurality of PTH vias, and wherein the plurality of openings of the plurality of magnetic interconnects vertically extend from the second conductive layer to the first conductive layer.

4. The inductor of claim 1, wherein the plurality of PTH vias vertically extend from the second conductive layer to the first conductive layer, and wherein the plurality of PTH vias conductively couple the second conductive layer to the first conductive layer.

5. The inductor of claim 1, wherein the plurality of openings of the plurality of magnetic interconnects expose a plurality of inner sidewalls of the plurality of magnetic interconnects.

6. The inductor of claim 5, wherein the plurality of inner sidewalls of the plurality of magnetic interconnects fully surround a plurality of outer sidewalls of the plurality of PTH vias, wherein the plurality of PTH vias have a width, and wherein the plurality of openings of the plurality of magnetic interconnects have a first width or a second width.

7. The inductor of claim 6, wherein the plurality of openings of the plurality of magnetic interconnects have the first width that is greater than the width of the plurality of PTH vias, or wherein the plurality of openings of the plurality of magnetic interconnects have the second width that is substantially equal to the width of the plurality of PTH vias.

8. The inductor of claim 7, wherein, when the plurality of openings of the plurality of magnetic interconnects have the first width, the insulating layer is in the plurality of openings of the plurality of magnetic interconnects, and wherein, when the plurality of openings of the plurality of magnetic interconnects have the first width, the insulating layer is directly between the plurality of inner sidewalls of the plurality of magnetic interconnects and the plurality of outer sidewalls of the plurality of PTH vias.

9. A method to form an inductor, comprising:
 patterning a plurality of first openings through a substrate layer;
 disposing a plurality of magnetic interconnects with a plurality of openings into the plurality of first openings of the substrate layer;
 disposing an insulating layer into the plurality of openings of the plurality of magnetic interconnects and the plurality of first openings of the substrate layer, wherein the insulating layer fully surrounds the plurality of magnetic interconnects;
 patterning a plurality of via openings through the insulating layer positioned within the plurality of openings of the plurality of magnetic interconnects;
 disposing a conductive material into the plurality of via openings to form a plurality of plated-through-hole (PTH) vias, wherein the plurality of openings of the plurality of magnetic interconnects surround the plurality of PTH vias, and wherein the insulating layer surrounds the plurality of PTH vias and the plurality of magnetic interconnects;
 disposing a first conductive layer over the plurality of PTH vias, the plurality of magnetic interconnects, and the insulating layer; and
 disposing a second conductive layer below the plurality of PTH vias, the plurality of magnetic interconnects, and the insulating layer.

10. The method of claim 9, wherein the plurality of magnetic interconnects have a thickness that is substantially equal to a thickness of the plurality of PTH vias, wherein the plurality of magnetic interconnects are shaped as a plurality of hollow cylindrical magnetic cores, wherein the plurality of hollow cylindrical magnetic cores include one or more magnetic materials, wherein the plurality of hollow cylindrical magnetic cores are a plurality of ferroelectric cores, wherein the one or more magnetic materials include one or more ferromagnetic materials, and wherein the one or more ferromagnetic materials include Co, Fe, $Fe_2O_3$, $FeOFe_2O_3$, $NiOFe_2O_3$, $CuOFe_2O_3$, $MgOFe_2O_3$, MnBi, Ni, MnSb, $MnOFe_2O_3$, $Y_3Fe_5O_{12}$, $CrO_2$, MnAs, or CdZnTe.

11. The method of claim 10, wherein the substrate layer has a thickness that is substantially equal to the thickness of the plurality of PTH vias, and wherein the plurality of openings of the plurality of magnetic interconnects vertically extend from the second conductive layer to the first conductive layer.

12. The method of claim 9, wherein the plurality of PTH vias vertically extend from the second conductive layer to the first conductive layer, and wherein the plurality of PTH vias conductively couple the second conductive layer to the first conductive layer.

13. The method of claim 9, wherein the plurality of openings the plurality of magnetic interconnects expose a plurality of inner sidewalls of the plurality of magnetic interconnects.

14. The method of claim 13, wherein the plurality of inner sidewalls of the plurality of magnetic interconnects fully surround a plurality of outer sidewalls of the plurality of PTH vias, wherein the plurality of PTH vias have a width, and wherein the plurality of openings of the plurality of magnetic interconnects have a first width or a second width.

15. The method of claim 14, wherein the plurality of openings of the plurality of magnetic interconnects have the first width that is greater than the width of the plurality of PTH vias, or wherein the plurality of openings of the plurality of magnetic interconnects have the second width that is substantially equal to the width of the plurality of PTH vias.

16. The method of claim 14, wherein, when the plurality of openings of the plurality of magnetic interconnects have the first width, the insulating layer is in the plurality of openings of the plurality of magnetic interconnects, and wherein, when the plurality of openings of the plurality of magnetic interconnects have the first width, the insulating layer is directly between the plurality of inner sidewalls of the plurality of magnetic interconnects and the plurality of outer sidewalls of the plurality of PTH vias.

17. The method of claim 14, wherein, when the plurality of openings of the plurality of magnetic interconnects have the second width, the insulating layer is in the plurality of openings of the plurality of magnetic interconnects, the plurality of inner sidewalls of the plurality of magnetic interconnects are directly adjacent and conductively coupled to the plurality of outer sidewalls of the plurality of PTH vias, and wherein, when the plurality of openings of the plurality of magnetic interconnects have the second width, the insulating layer is only in between the plurality of magnetic interconnects and the substrate layer.

18. A semiconductor package, comprising:
 a substrate on a package substrate;
 an inductor in or on the substrate or the package substrate; and
 a die on the substrate, wherein the inductor includes;
  a substrate layer in the substrate or the package substrate;
  a plurality of first magnetic interconnects or a plurality of second magnetic interconnects in the substrate layer, wherein the plurality of first magnetic interconnects include a plurality of openings that surround a plurality of plated-through-hole (PTH) vias, or wherein the plurality of second magnetic interconnects include a plurality of outer magnetic shells that surround a plurality of inner conductive conductors;

an insulating layer in the substrate layer, wherein the insulating layer laterally surrounds and is in contact with an outermost surface of the plurality of first magnetic interconnects or the plurality of second magnetic interconnects;

a first conductive layer over the insulating layer, and the plurality of first magnetic interconnects or the plurality of second magnetic interconnects; and a second conductive layer below the insulating layer, and the plurality of first magnetic interconnects or the plurality of second magnetic interconnects.

19. The semiconductor package of claim 18, wherein the plurality of first magnetic interconnects or the plurality of second magnetic interconnects have a thickness that is substantially equal to a thickness of the substrate layer, wherein the plurality of first magnetic interconnects are shaped as a plurality of hollow cylindrical magnetic cores, wherein the plurality of hollow cylindrical magnetic cores include one or more magnetic materials, wherein the plurality of hollow cylindrical magnetic cores are a plurality of ferroelectric cores, wherein the one or more magnetic materials include one or more ferromagnetic materials, wherein the one or more ferromagnetic materials include Co, Fe, $Fe_2O_3$, $FeOFe_2O_3$, $NiOFe_2O_3$, $CuOFe_2O_3$, $MgOFe_2O_3$, MnBi, Ni, MnSb, $MnOFe_2O_3$, $Y_3Fe_5O_{12}$, $CrO_2$, MnAs, or CdZnTe, wherein the plurality of outer magnetic shells of the plurality of second magnetic interconnects include the one or more ferromagnetic materials and the plurality of inner conductive conductors of the plurality of second magnetic interconnects are a plurality of copper conductors, wherein the plurality of first magnetic interconnects or the plurality of second magnetic interconnects vertically extend from the second conductive layer to the first conductive layer, and wherein the plurality of PTH vias of the plurality of first magnetic interconnects conductively couple the second conductive layer to the first conductive layer, or the plurality of inner conductive conductors of the plurality of second magnetic interconnects conductively couple the second conductive layer to the first conductive layer.

20. The semiconductor package of claim 19, wherein the plurality of openings of the plurality of first magnetic interconnects vertically extend from the second conductive layer to the first conductive layer.

21. The semiconductor package of claim 19, wherein the plurality of openings of the plurality of first magnetic interconnects expose a plurality of inner sidewalls of the plurality of first magnetic interconnects, wherein the plurality of inner sidewalls of the plurality of first magnetic interconnects fully surround a plurality of outer sidewalls of the plurality of PTH vias, wherein the plurality of PTH vias are shaped as a plurality of hollow cylindrical plated vias that surround a plurality of gaps, wherein the plurality of gaps are comprised of one or more epoxy materials, wherein the plurality of PTH vias have a width, and wherein the plurality of openings of the plurality of first magnetic interconnects have a first width or a second width.

22. The semiconductor package of claim 21, wherein the plurality of openings of the plurality of first magnetic interconnects have the first width that is greater than the width of the plurality of PTH vias, or wherein the plurality of openings of the plurality of first magnetic interconnects have the second width that is substantially equal to the width of the plurality of PTH vias.

23. The semiconductor package of claim 21, wherein, when the plurality of openings of the plurality of first magnetic interconnects have the first width, the insulating layer is in the plurality of openings of the plurality of first magnetic interconnects, and wherein, when the plurality of openings of the plurality of first magnetic interconnects have the first width, the insulating layer is directly between the plurality of inner sidewalls of the first magnetic interconnects and the plurality of outer sidewalls of the plurality of PTH vias.

* * * * *